(12) United States Patent
Zhu et al.

(10) Patent No.: US 11,540,428 B2
(45) Date of Patent: Dec. 27, 2022

(54) NETWORK EQUIPMENT POWER SUPPLY AND HEAT DISSIPATION SYSTEM THEREFOR

(71) Applicant: Delta Electronics, Inc., Taoyuan (TW)

(72) Inventors: Li Zhu, Taoyuan (TW); Kai Dong, Taoyuan (TW); Yong Huang, Taoyuan (TW); Jun Yang, Taoyuan (TW); Jie Ruan, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

(21) Appl. No.: 17/010,840

(22) Filed: Sep. 3, 2020

(65) Prior Publication Data
US 2021/0176900 A1    Jun. 10, 2021

(30) Foreign Application Priority Data
Dec. 10, 2019  (CN) .......................... 201911256557.0

(51) Int. Cl.
*H05K 7/20*  (2006.01)

(52) U.S. Cl.
CPC ..... *H05K 7/20927* (2013.01); *H05K 7/20145* (2013.01); *H05K 7/20272* (2013.01)

(58) Field of Classification Search
CPC . H05K 7/20136–2019; H05K 7/20218; H05K 7/20254; H05K 7/20727; H05K 7/20772; H05K 7/20909; H05K 7/20927
See application file for complete search history.

(56) References Cited

U.S. PATENT DOCUMENTS

| 5,954,823 A | * | 9/1999 | Cutts ....................... G06F 1/189 |
| | | | 714/14 |
| 6,519,146 B2 | * | 2/2003 | Nagashima ....... G02F 1/133385 |
| | | | 165/104.33 |
| 7,187,549 B2 | * | 3/2007 | Teneketges ........... H01L 23/473 |
| | | | 165/104.33 |

(Continued)

FOREIGN PATENT DOCUMENTS

| CN | 107072107 A | 8/2017 |
| CN | 109874275 A | 6/2019 |

*Primary Examiner* — Zachary Pape
(74) *Attorney, Agent, or Firm* — CKC & Partners Co., LLC (57) ABSTRACT

The disclosure provides a network equipment power supply and a heat dissipation system therefor. The heat dissipation system includes a liquid-cooling heat dissipation device and an air-cooling heat dissipation device. The liquid-cooling heat dissipation device includes a liquid inlet, a liquid outlet, and a liquid-cooling pipe between them, wherein liquid-cooling medium flows inside the liquid-cooling pipe and takes away heat generated by components arranged around the liquid-cooling pipe; The air-cooling heat dissipation device includes an air inlet, an air outlet, and an air-cooling channel between them, wherein airflow passes through the air-cooling channel and takes away heat generated by components arranged around the air-cooling channel. The disclosure conducts hybrid heat dissipation combining characteristics of liquid-cooling heat dissipation and air-cooling heat dissipation to effectively enhance heat dissipation efficiency, and provides a new choice for design of a power supply unit with high power density.

14 Claims, 7 Drawing Sheets

(56) References Cited

U.S. PATENT DOCUMENTS

| | | | | |
|---|---|---|---|---|
| 7,535,707 | B2* | 5/2009 | Seibold | G06F 1/20 |
| | | | | 361/695 |
| 8,596,338 | B2* | 12/2013 | Chen | F28D 15/0266 |
| | | | | 165/80.4 |
| 9,019,705 | B2* | 4/2015 | Tung | G06F 1/20 |
| | | | | 361/701 |
| 10,416,736 | B2* | 9/2019 | Dupont | H05K 7/20809 |
| 10,477,725 | B2* | 11/2019 | Chen | H05K 7/20263 |
| 10,791,655 | B2* | 9/2020 | Cader | H05K 7/20781 |
| 10,955,883 | B1* | 3/2021 | Franz | H05K 7/20927 |
| 2006/0227504 | A1* | 10/2006 | Chen | H05K 7/20927 |
| | | | | 361/679.47 |
| 2015/0109731 | A1* | 4/2015 | Umematsu | H05K 7/20727 |
| | | | | 361/691 |
| 2018/0066663 | A1* | 3/2018 | Kulkarni | H05K 7/20172 |
| 2021/0100137 | A1* | 4/2021 | Harrington | H05K 7/20781 |
| 2021/0274683 | A1* | 9/2021 | Lee | H05K 7/20763 |

* cited by examiner

NETWORK EQUIPMENT POWER SUPPLY AND HEAT DISSIPATION SYSTEM THEREFOR

CROSS-REFERENCE TO RELATED APPLICATIONS

This non-provisional application claims priority under 35 U.S.C. § 119(a) on Patent Application No. 201911256557.0 filed in P. R. China on Dec. 10, 2019, the entire contents of which are hereby incorporated by reference.

Some references, if any, which may include patents, patent applications and various publications, may be cited and discussed in the description of this invention. The citation and/or discussion of such references, if any, is provided merely to clarify the description of the present invention and is not an admission that any such reference is "Prior Art" to the present invention described herein. All references listed, cited and/or discussed in this specification are incorporated herein by reference in their entireties and to the same extent as if each reference was individually incorporated by reference.

BACKGROUND OF THE INVENTION

1. Field of the Invention

The disclosure relates to a heat dissipation system, and in particular, to a network equipment power supply and a heat dissipation system therefor.

2. Related Art

With innovation and development of distributed computing architectures such as artificial intelligence, cloud computing, big data, and so on, data center acting as information infrastructure undertakes an increasing amount of calculation, and has a higher requirement for computational efficiency. To cope with various challenges, power density of the data center is rising, and since the traditional air-cooling heat dissipation is fatigue in facing the high density, heat dissipation efficiency is gradually unable to keep pace with the computational efficiency. Regardless of large cloud computing data center, or small edge data center, liquid-cooling heat dissipation reflects a better using effect. The liquid-cooling heat dissipation has the following advantages: (1) large specific heat capacity and high heat dissipation efficiency; (2) reducing power consumption, and decreasing outlay cost; (3) saving energy, protecting environment, and reducing noise index.

Moreover, temperature also has a large influence on quality and safety of a Power Supply Unit (PSU, sometimes it is also short for "power supply"). Currently, the PSU, especially for AC-DC PSU, commonly uses the way of air-cooling heat dissipation and natural heat dissipation, but the maximum power density that can be coped with by these two heat dissipation ways is estimated to be 100 W/in$^3$. As for the PSU with a power density larger than 100 W/in$^3$, thermal design is still a difficult problem to be solved.

Therefore, with development of power supply products with a high power density, how to provide a choice for thermal design of power supply products with high power density also becomes an urgent issue to be solved.

SUMMARY OF THE INVENTION

The present disclosure provides a heat dissipation system for a network equipment power supply, comprising:

a liquid-cooling heat dissipation device including a liquid inlet, a liquid outlet, and a liquid-cooling pipe between the liquid inlet and the liquid outlet, wherein liquid-cooling medium flows inside the liquid-cooling pipe and takes away heat generated by components arranged around the liquid-cooling pipe; and an air-cooling heat dissipation device including an air inlet, an air outlet, and an air-cooling channel between the air inlet and the air outlet, wherein airflow passes through the air-cooling channel and takes away heat generated by components arranged around the air-cooling channel.

The present disclosure further provides a network equipment power supply, and the network equipment power supply is configured to include the above heat dissipation system.

The disclosure realizes a hybrid design of heat dissipation making use of characteristics of liquid-cooling heat dissipation and air-cooling heat dissipation, and the characteristic of better heat dissipation capability of liquid-cooling is utilized to conduct liquid-cooling heat dissipation for heat dense integration area and high loss devices such as transformer, and the characteristics of poor heat dissipation capability, while non-conductivity, good flowability, and small corrosion of air-cooling are utilized to conduct air-cooling heat dissipation for devices with little heat and located remotely, such that heat dissipation efficiency can be enhanced effectively, and a new choice may be provided for thermal design of the PSU with high power density through a combination thereof.

BRIEF DESCRIPTION OF THE DRAWINGS

To make aforementioned and other objects, features, advantages and embodiments of the disclosure more obvious and understandable, the accompanying drawings are provided as follows.

DETAILED EMBODIMENTS OF THE INVENTION

To make the disclosure more explicit and complete, reference can be made to the accompanying drawings and the various embodiments, wherein the same numbers in the drawings represent the same or similar components. On the other hand, the commonly known components and steps are not described in the embodiment to avoid unnecessary limitations to the disclosure. In addition, to simplify the drawings, some known common structures and elements are illustrated in a simple way in the drawings.

Hereinafter the detailed embodiments of the disclosure are further explained with reference to the accompanying drawings and examples, but the protection scope of the disclosure is not limited thereto. It shall be pointed out that processes or signs without special explanations can be understood or implemented by those skilled in the art with reference to the prior arts.

In FIGS. 1A-1D, a spatial structure of a first embodiment of a heat dissipation system 100 for a network equipment power supply 200 according to the disclosure is illustrated. The heat dissipation system 100 comprises a liquid-cooling heat dissipation device 10 and an air-cooling heat dissipation device 20 to form a structure of hybrid heat dissipation.

The liquid-cooling heat dissipation device 10 includes a liquid inlet 11, a liquid outlet 12, and a liquid-cooling pipe 13 between the liquid inlet 11 and the liquid outlet 12. The liquid-cooling medium flows inside the liquid-cooling pipe 13 and takes away heat generated by first devices 211, 212, 213 arranged around the liquid-cooling pipe 13. In this embodiment, the liquid-cooling medium may include but is not limited to water, for example. The first devices may include but are not limited to high loss devices having large heat production, such as, a MOS transistor, a rectifier bridge, a transformer, a heating module, and the like. For example, the first device 211 may be a printed circuit board (PCB) module, the first device 212 may be a power component such as a MOS transistor, and the first device 213 may be a heating module such as a transformer. The expression "arranged around the liquid-cooling pipe" refers to but is not limited to arrangement surrounding one or more sides around the liquid-cooling pipe. For example, it may refer to arrangement on one side of the liquid-cooling pipe, or arrangement on both sides of the liquid-cooling pipe, or arrangement around the liquid-cooling pipe, or the like. In this embodiment, the liquid inlet 11 and the liquid outlet 12 are arranged on the same side, for example, a left side (a front side as shown in FIG. 1C) of the liquid-cooling heat dissipation device 10, and may be provided with hydraulic quick connectors 31 and 32 respectively through which a quick connection between the liquid-cooling heat dissipation device 10 and an external liquid medium source (for example, an external water source) may be made, and liquid in-flow and out-flow may be better controlled. The liquid medium may flow in from the hydraulic quick connector 31 on the liquid inlet 11, and flows out from the hydraulic quick connector 32 on the liquid outlet 12 after flowing through the liquid-cooling pipe 13. As shown in FIG. 1B, the liquid medium flows in from a solid arrow direction I, and flows out from a solid arrow direction O in the figure. In other embodiment, the liquid inlet 11 and the liquid outlet 12 may also be arranged on different sides of the liquid-cooling heat dissipation device 10.

The air-cooling heat dissipation device 20 includes an air inlet 21, an air outlet 22, and an air-cooling channel 23 between the air inlet 21 and the air outlet 22. Airflow passes through the air-cooling channel 23 and takes away heat generated by the components around the air-cooling channel 23. In this embodiment, the air inlet 21, for example, is arranged on a back side of the network equipment power supply 200, as shown in FIG. 1D, and the air outlet 22, for example, is arranged on a front side of the network equipment power supply 200, as shown in FIG. 1C. Moreover, the airflow, for example, comes from a fan 24 of the network equipment power supply 200, and the fan 24 may be provided within a housing 201 of the network equipment power supply 200, and also may be provided out of the housing 201 of the network equipment power supply 200. The airflow may be introduced into the network equipment power supply 20 from outside through the fan 24. The introduced airflow flows through the air-cooling channel 23 shown in a dotted arrow direction A in FIG. 1B, takes away heat generated by the network equipment power supply 200, and flows out from the air outlet 22.

In this embodiment, as shown in FIG. 1B, the liquid-cooling pipe 13 is provided inside the network equipment power supply 200. Also, the liquid-cooling pipe 13 may be a straight liquid-cooling pipe adjacent or attached to one side of an inner wall 2011 of the housing 201 of the network equipment power supply 200, for example. In this embodiment, power components with high losses or more heat (such as, including but not limited to a printed circuit board module 211, a power component 212, a heating module 213, and the like) are arranged around the liquid-cooling pipe 13 (attached or adjacent to the liquid-cooling pipe 13, for example), so as to be largely under water-cooling heat dissipation to have a large amount of concentrated heat taken away. Meanwhile, the airflow generated by operation of the fan 24 may conduct air-cooling heat dissipation to heat generated by the network equipment power supply 200 including first devices 211-213 arranged around the liquid-cooling pipe 13 and second devices 221-222 far away from the liquid-cooling pipe 13, thereby achieving hybrid heat dissipation combining water-cooling heat dissipation and air-cooling heat dissipation and effectively enhancing heat dissipation efficiency. In addition, the second devices 221-222 far away from the liquid-cooling pipe 13 may also conduct heat to the liquid-cooling pipe 13 or the housing 201 for heat dissipation by using of heat conducting glue, heat conducting gasket, or other heat conducting structures.

Figure 1A:
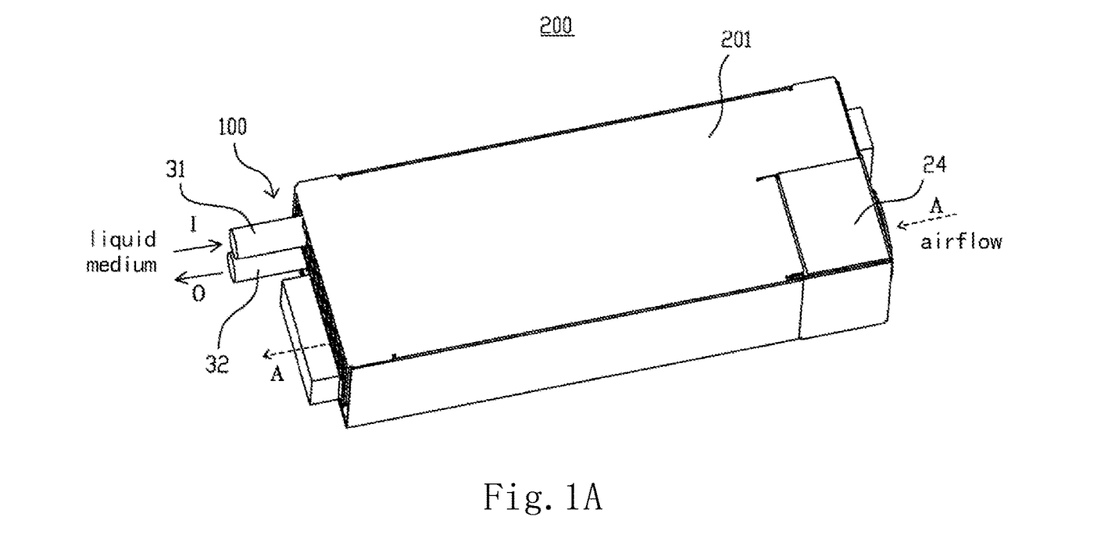
FIG. 1A is a structural diagram of a first embodiment of a heat dissipation system for a network equipment power supply.
Figure 1B:
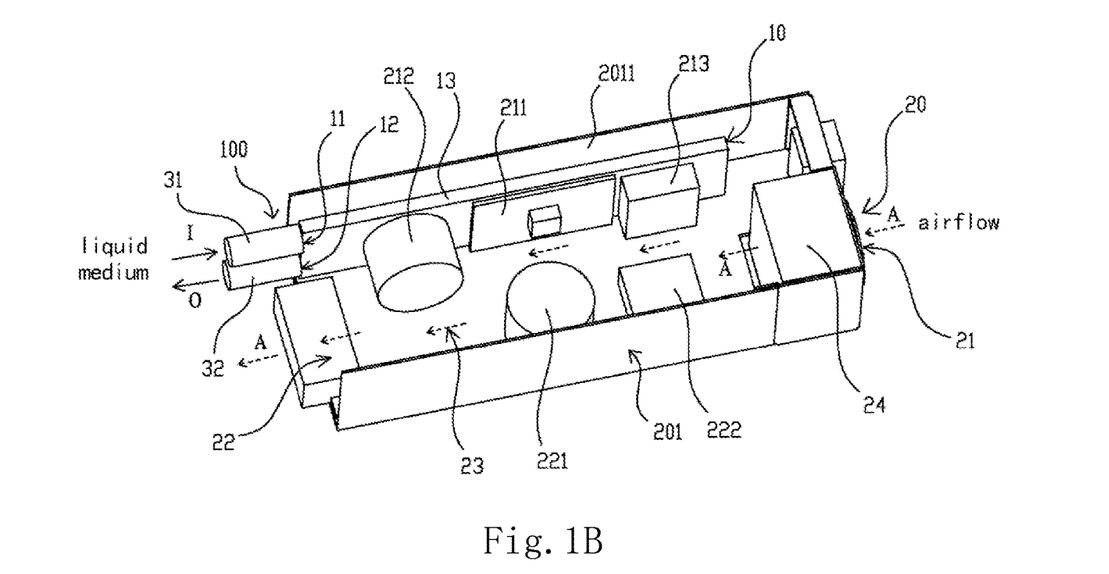
FIG. 1B is a spatial structural diagram with an upper cover of a housing removed in FIG. 1A.
Figure 1C:
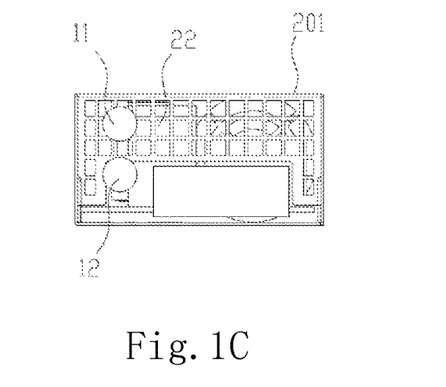
FIG. 1C is a front view of FIG. 1A.
Figure 1D:
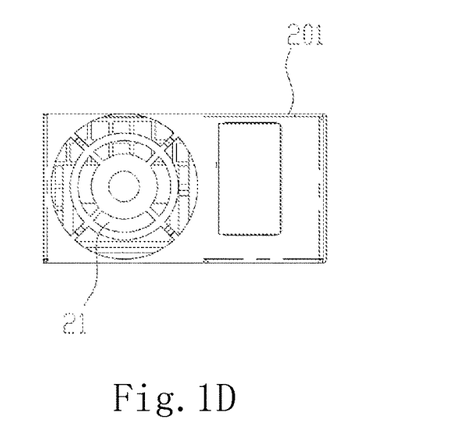
FIG. 1D is a back view of FIG. 1A.
Figure 1E:
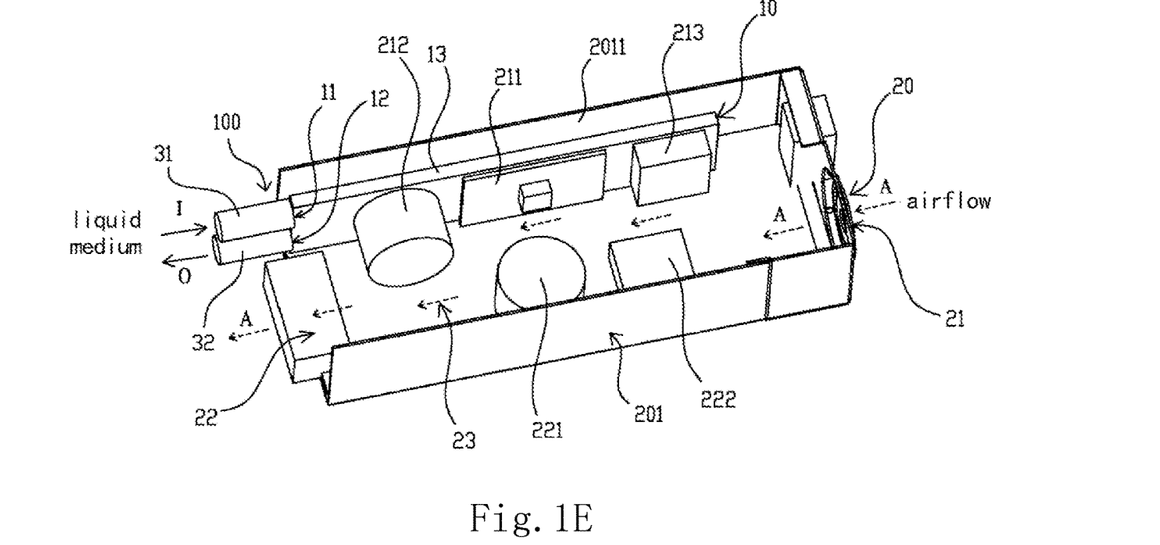
FIG. 1E illustrates a modification of the heat dissipation system of FIG. 1B.

FIG. 1E illustrates a modification of the heat dissipation system 100 of FIG. 1B, which differs from the first embodiment shown in FIGS. 1A to 1D in that the airflow comes from outside of the network equipment power supply 200, and may be system air from the fan of a network equipment cabinet, for example, or natural wind.

FIGS. 2A to 2D illustrate a structure of a second embodiment of a heat dissipation system 100 for a network equipment power supply according to the disclosure, which differs from the first embodiment shown in FIGS. 1A to 1D in that the liquid-cooling pipe 13' is arranged outside of the network equipment power supply 200, such as, over top of an upper cover 2012 of the housing 201 of the network equipment power supply 200. Other structures of the heat dissipation system 100 are substantially the same as that in the first embodiment shown in FIGS. 1A to 1D, so the details are omitted herein. In this embodiment, the liquid-cooling pipe 13', for example, may be the straight liquid-cooling pipe thermally coupled to the top of the upper cover 2012 of the housing 201. The fan 24 of the network equipment power supply 200 may be mounted within or out of the housing 201. The first device 213 (such as, a thermal surface-mounted device or a PCB board) may be attached or adjacent to the upper cover 2012 of the housing 201. Alternatively, the housing 201 may also have a heat conducting member (such as, heat conducting glue, heat conducting gasket, or the like), and the first device 213 may be attached to the housing 201 through the heat conducting member. The device slightly far away may conduct heat to the upper cover 2012 of the housing 201 for heat dissipation by using of heat conducting glue, heat conducting gasket, or other heat conducting structures. Most of heat generated by the first device 213 arranged around the liquid-cooling pipe 13' may be taken away by the liquid-cooling pipe 13' in the way of water-cooling heat dissipation, and heat generated by the device far away from the liquid-cooling pipe 13' and a part of heat generated by the first device 213 may be blown away by the fan 24.

In this embodiment, the top of the upper cover 2012 of the housing 201 and the liquid-cooling pipe 13' may also be filled with heat conducting glue therebetween for conducting heat and flattening the interface.

Figure 2A:
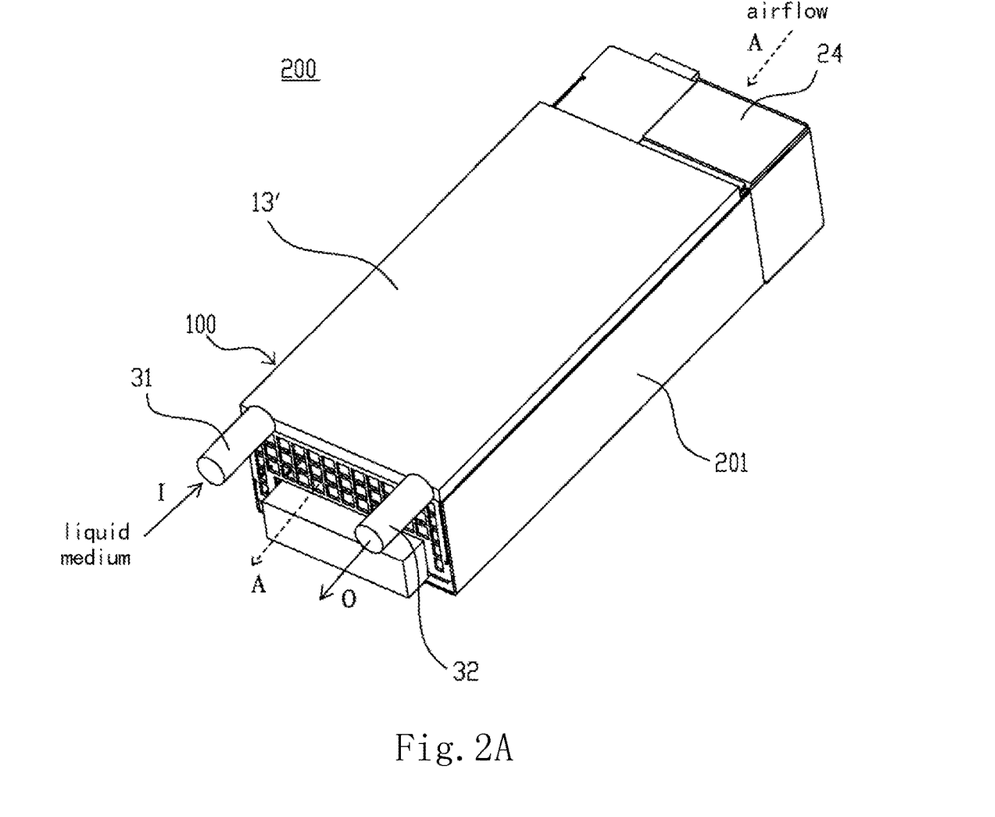
FIG. 2A is a spatial structural diagram of a second embodiment of a heat dissipation system for a network equipment power supply.
Figure 2B:
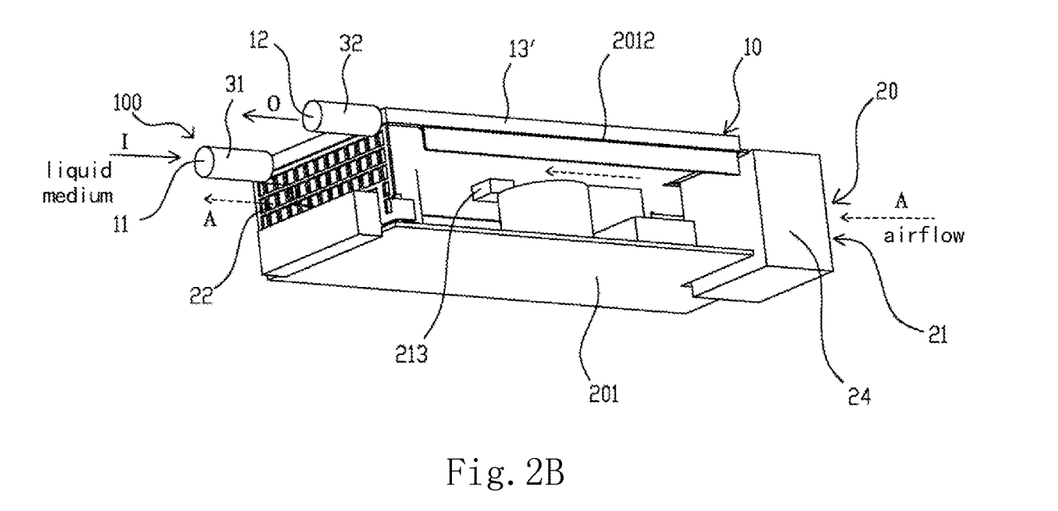
FIG. 2B is a structural diagram with an upper cover of a housing removed in FIG. 2A.
Figure 2C:
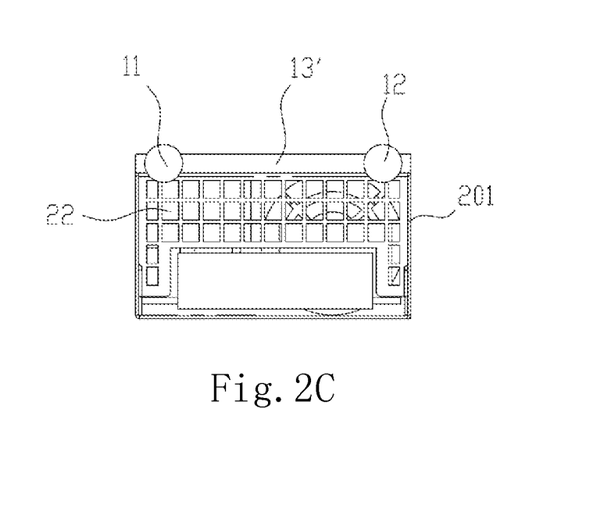
FIG. 2C is a front view of FIG. 2A.
Figure 2D:
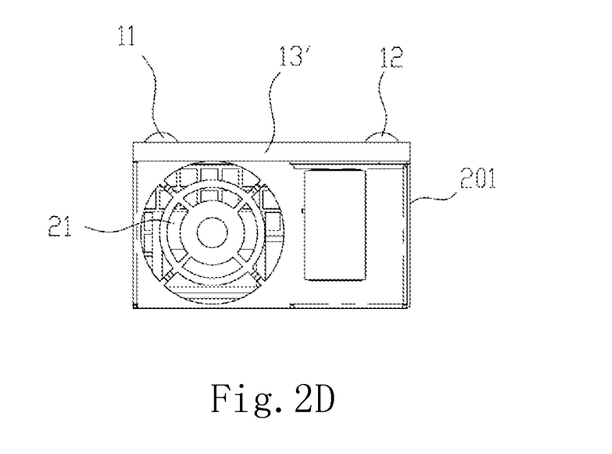
FIG. 2D is a back view of FIG. 2A.
Figure 2E:
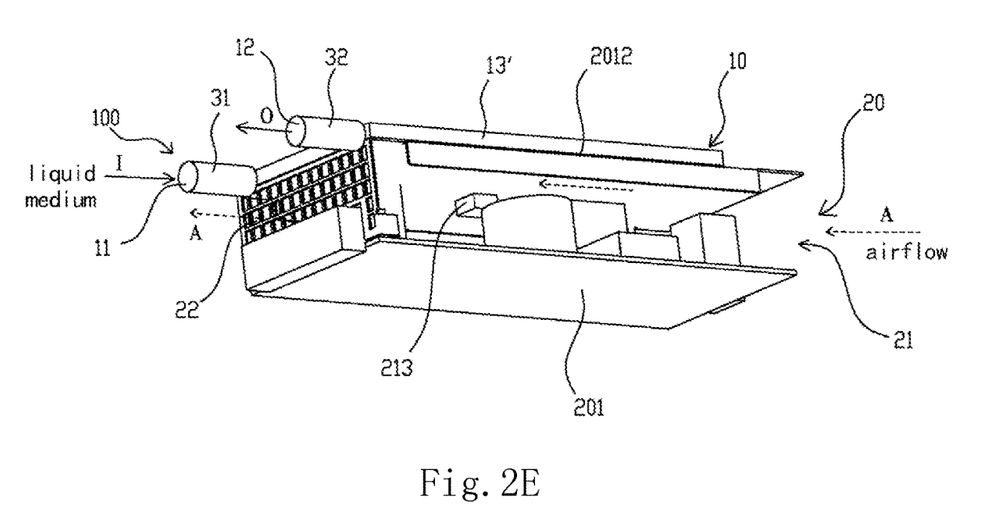
FIG. 2E is a modification of the heat dissipation system of FIG. 2B.

FIG. 2E illustrates a modification of the heat dissipation system 100 of FIG. 2A, which differs from the second embodiment shown in FIGS. 2A to 2D in that the airflow comes from outside of the network equipment power supply 200, and may be system air from the fan of a network equipment cabinet for example, or natural wind.

Figure 2F:
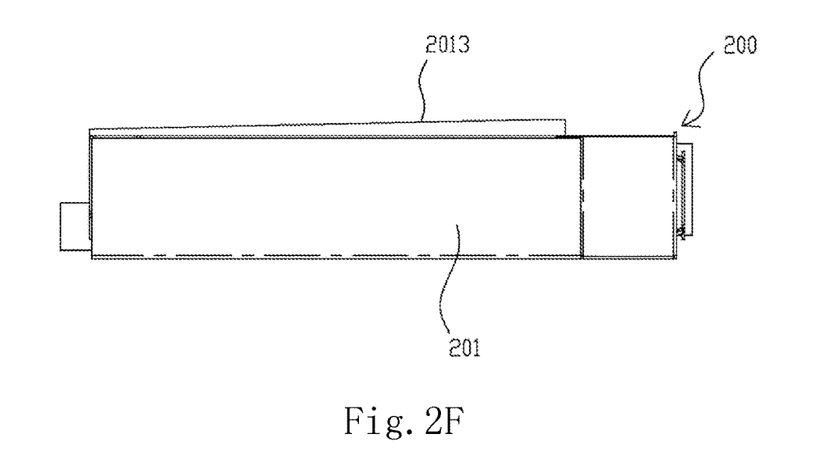
FIG. 2F is a side view of the network equipment power supply when a liquid-cooling heat dissipation device of the heat dissipation system of FIG. 2A is mounted on a network equipment cabinet, wherein a top of the network equipment power supply is a wedge structure.

In other embodiments, the liquid-cooling heat dissipation device 10 of the heat dissipation system 100 may be mounted in a network equipment cabinet where the network equipment power supply 200 is insertable mounted, and the outside of the housing 201 of the network equipment power supply 200 is thermally coupled to the liquid-cooling pipe 13' after the insertion. FIG. 2F is a side view of the network equipment power supply when a liquid-cooling heat dissipation device of the heat dissipation system of FIG. 2A is mounted on a network equipment cabinet. A top 2013 of the network equipment power supply 200 may be a wedge structure. The wedge structure may match well with the liquid-cooling pipe 13' mounted in the network equipment cabinet when the network equipment power supply is inserted into the network equipment cabinet so as to enhance heat dissipation efficiency and system reliability.

Figure 3:
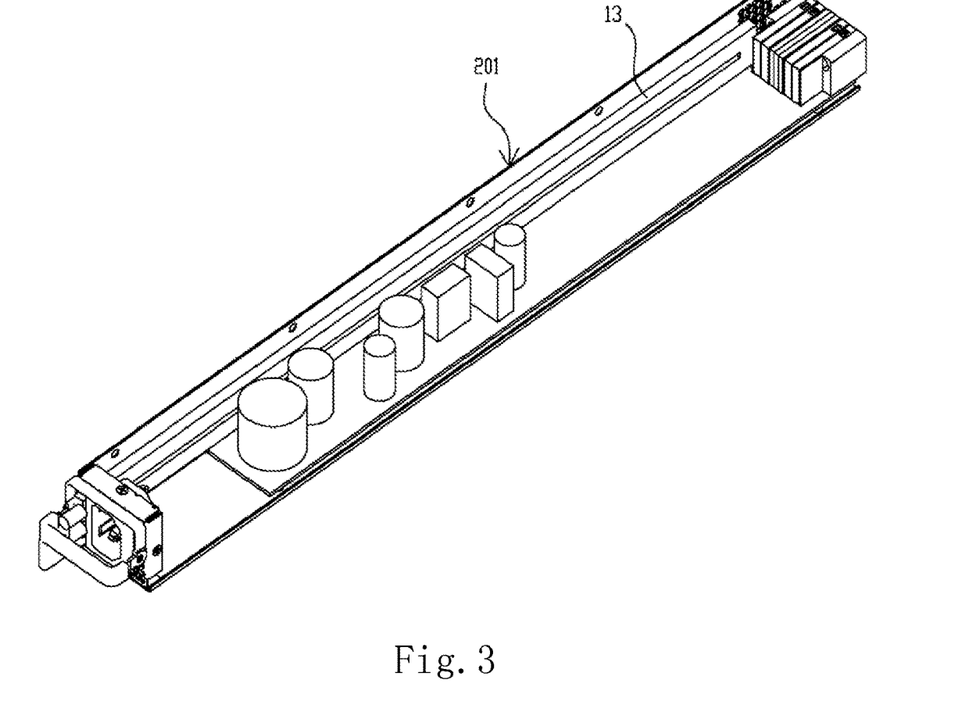
FIG. 3 illustrates another modification of the heat dissipation system of FIG. 1B.

FIG. 3 illustrates another modification of the heat dissipation system 100 of FIG. 1B. The liquid-cooling pipe 13 is provided in an internal space of the housing 201 of the network equipment power supply. When the heating components on the PCB may be arranged along one line, the liquid-cooling pipe 13 may be arranged in a line shape, and provided on one side of the housing 201 for liquid-cooling heat dissipation with one surface of the liquid-cooling pipe 13.

Figure 4:
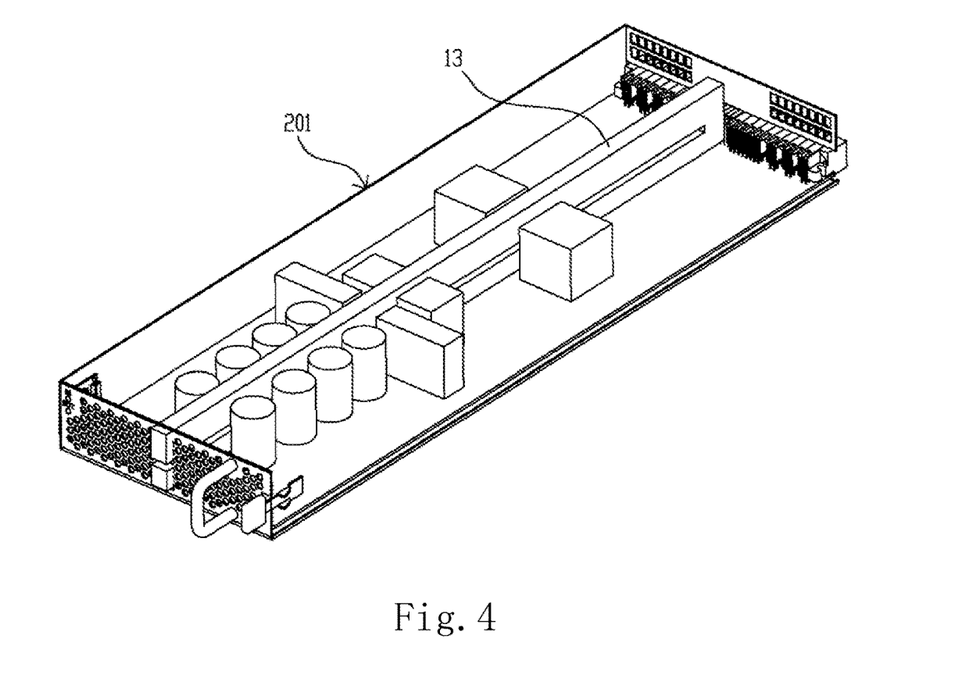
FIG. 4 illustrates a spatial structural diagram of a third embodiment of a heat dissipation system for a network equipment power supply.

FIG. 4 illustrates a structure of a third embodiment of a heat dissipation system for a network equipment power supply according to the disclosure. The liquid-cooling pipe 13 is the straight liquid-cooling pipe provided in middle of the housing 201 of the network equipment power supply for liquid-cooling heat dissipation with two surfaces of the liquid-cooling pipe 13, such that heat dissipation efficiency is further enhanced. Taking thermal design of a 10 KW network equipment power supply for example, when designing, heating components such as the MOS transistor, the rectifier bridge, the module, and the like may be directly attached to the straight liquid-cooling pipe 13, irregular heating components such as magnetic elements, and the like are arranged to be adjacent to the straight liquid-cooling pipe 13, and if necessary, heat may be conducted to the straight liquid-cooling pipe 13 by encapsulating heat conducting glue. Moreover, there is system air, which may be blown into the network equipment power supply for air-cooling heat dissipation of partial inside components, outside of the network equipment power supply. In such way, heat dissipation of the network equipment power supply may be efficiently solved by the way of heat dissipation combining liquid-cooling heat dissipation and air-cooling heat dissipation.

Figure 5:
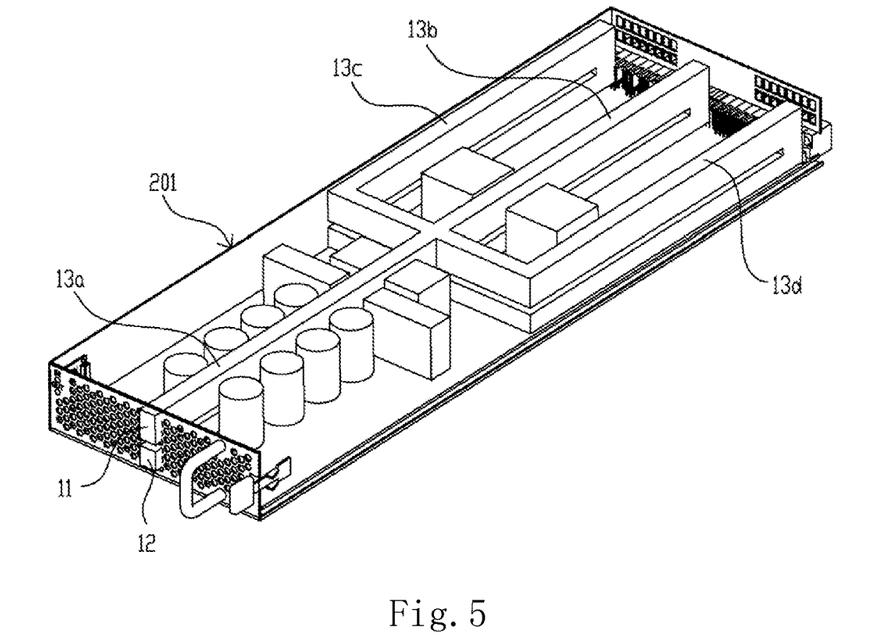
FIG. 5 illustrates a spatial structural diagram of a fourth embodiment of a heat dissipation system for a network equipment power supply.

FIG. 5 illustrates a structure of a fourth embodiment of a heat dissipation system for a network equipment power supply according to the disclosure. The liquid-cooling pipe 13 is a multidirectional liquid-cooling pipe having a plurality of furcation branches, and may comprise one shared portion 13a and a plurality of furcation branch portions 13b, 13c, 13d, for example. When the heating components on the PCB are dispersed, liquid-cooling heat dissipation may be conducted using this multidirectional liquid-cooling pipe structure. The multidirectional liquid-cooling pipe 13 has the single liquid inlet 11 and the single liquid outlet 12, and the plurality of furcation branch portions 13b, 13c, 13d of the liquid-cooling pipe 13 share the liquid inlet 11 and the liquid outlet 12, and extend in multiple directions to area with severely heated devices. At this time, the dispersed heating components may contact the liquid-cooling pipe 13 for liquid-cooling heat dissipation.

Figure 6:
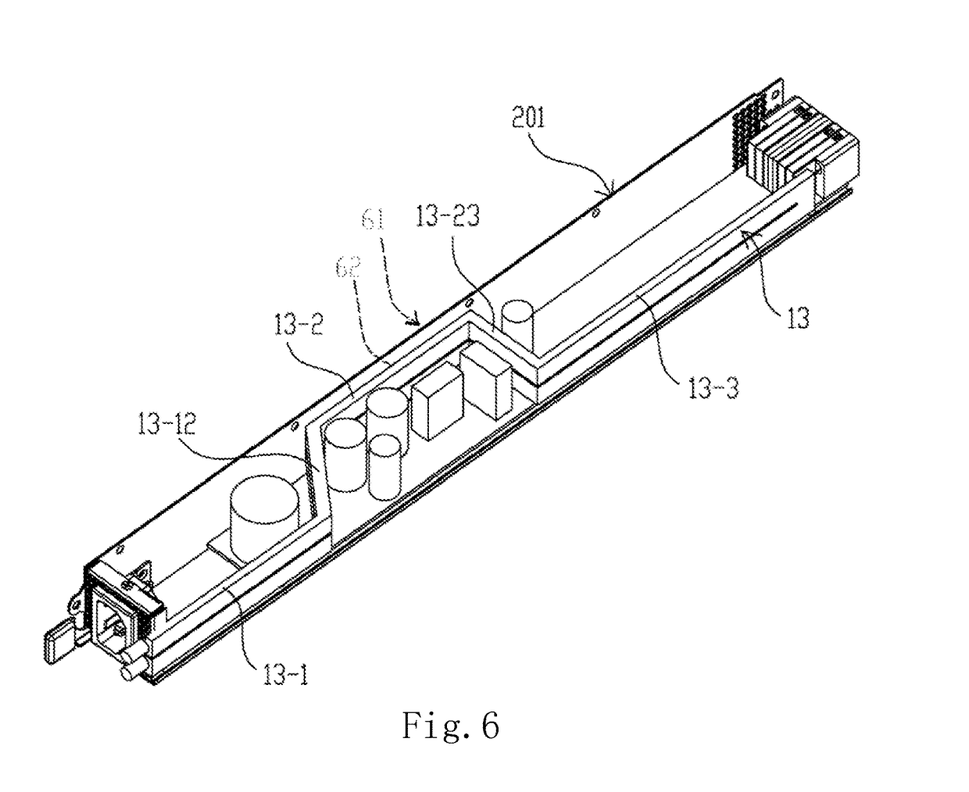
FIG. 6 illustrates a spatial structural diagram of a fifth embodiment of a heat dissipation system for a network equipment power supply.

FIG. 6 illustrates a structure of a fifth embodiment of a heat dissipation system for a network equipment power supply according to the disclosure. The liquid-cooling pipe 13 is the bending liquid-cooling pipe having bending portions, and may comprise a plurality of straight portions 13-1, 13-2, 13-3, the bending portion 13-12 between the straight portions 13-1 and 13-2, and the bending portion 13-23 between the straight portions 13-2 and 13-3, for example. Moreover, the straight portions 13-1, 13-2, 13-3 are adjacent or attached to one side of the inner wall of the housing 201 of the network equipment power supply. For example, the straight portions 13-1 and 13-3 are provided on an inner side of a right sidewall of the housing 201 shown in the figure, the straight portion 13-2 is provided on an inner side of a left sidewall of the housing 201 shown in the figure, and the bending portions 13-12 and 13-23 are connected to the straight portions 13-1, 13-2, 13-3. The bending portions 13-12 and 13-23 are made of a deformable material. In other words, the liquid-cooling pipe 13 may change directions according to positions of electrical elements, and is prepared into a shape with multiple bending, such that a cooling liquid may flow through the network equipment power supply in any directions such as a horizontal direction, a longitudinal direction, a slant direction, and the like, and layout of the electronic devices is less affected by the liquid-cooling pipe. Such layout has a higher flexibility than the straight line layout of the liquid-cooling pipe, allows heat dissipation with several surfaces, and has a higher efficiency.

In this disclosure, when using the layout shown in FIGS. 3 to 6, it may be designed in such way that a part of the liquid-cooling pipe 13 is adjacent or attached to one side of the inner wall of the housing of the network equipment power supply, and the other portion is provided in middle of the housing of the network equipment power supply. Furthermore, the liquid-cooling pipe 13 may also have a first part surface, e.g., 62 (FIG. 6), exposed by a first opening, e.g., 61 (FIG. 6), on the housing of the network equipment power supply corresponding thereto; or attached to the inner wall of the housing of the network equipment power supply. In other words, when there is a layout that one part of the liquid-cooling pipe is attached to the housing, for example, when the straight portions 13-1, 13-2, 13-3 shown in FIG. 6 are attached to the housing 201, the housing with an attached portion may be removed, and replaced with the corresponding sidewall of the liquid-cooling pipe. Alternatively, the sidewall of the liquid-cooling pipe may attach to the inner wall of the housing of the network equipment power supply in such way that a large area of housing becomes to a heating conducting sheet of the liquid-cooling pipe. In addition to heat dissipation by using of the liquid-cooling pipe, the heating components may also conduct heat to the housing, such that heat dissipation efficiency is further enhanced.

Through the layout of the liquid-cooling pipe, without increasing an external size, the liquid-cooling pipe may flexibly reach the heating area inside the network equipment power supply, a contact area between the heating area and the liquid-cooling pipe is increased, and more heating components may be attached to a surface of the liquid-cooling pipe, so as to achieve the objects of improving heat dissipation amount, reducing temperature of components inside the network equipment power supply, and solving quality and safety problems caused by extremely high temperature of the network equipment power supply with a high power density.

The disclosure further provides a network equipment power supply 200 comprising the above heat dissipation system 100, as shown in FIG. 1A. The network equipment power supply 200 is suitable for a server or a data center.

The disclosure realizes a hybrid design of heat dissipation making use of characteristics of liquid-cooling (or water-cooling) heat dissipation and air-cooling heat dissipation. The characteristic of strong heat dissipation capability of liquid-cooling is utilized to conduct liquid-cooling heat dissipation for heat dense integration area and high loss devices such as transformer, and the characteristics of poor heat dissipation capability, while non-conductivity, good flowability, and small corrosion of air-cooling are utilized to conduct air-cooling heat dissipation for devices with little heat and located remotely. In such way, some designs of PSU (such as AC-DC PSU) with high power density may be effectively solved through a combination thereof.

The disclosure may largely reduce PSU noises, and may be applied to sites having a high requirement for noises such as medical treatment through application of liquid-cooling heat dissipation.

The disclosure may enhance heat dissipation capability of the PSU, and solve the problem of heat dissipation effectively within a quite limited space.

The disclosure may promote application of water cooling in the industries of communication server and network server, and improve power densities of the system and the network equipment.

Although the disclosure has been disclosed by the above embodiments, any skilled technicians shall make various changes and modifications without departing from spirit and scope of the disclosure, so the protection scope of the disclosure shall be determined by the scope defined by the appended claims.

What is claimed is:

1. A heat dissipation system for a network equipment power supply, comprising:
   a first heat dissipation device having a liquid inlet, a liquid outlet, and a liquid-cooling pipe between the liquid inlet and the liquid outlet, wherein liquid-cooling medium flows inside the liquid-cooling pipe and takes away heat generated by components arranged around the liquid-cooling pipe; and
   a second heat dissipation device having an air inlet, an air outlet, and an air-cooling channel between the air inlet and the air outlet, wherein airflow passes through the air-cooling channel and takes away heat generated by components arranged around the air-cooling channel,
   wherein the liquid-cooling pipe is arranged within the network equipment power supply and has a first part surface exposed by a first opening in a wall of a housing of the network equipment power supply that is attached to the liquid-cooling pipe, wherein the first opening is formed by removing a portion of the wall of the housing so that the first part surface of the liquid-cooling pipe replaces said portion of the housing.

2. The heat dissipation system according to claim 1, wherein the liquid-cooling pipe is a straight liquid-cooling pipe, or a bending liquid-cooling pipe, or a multidirectional liquid-cooling pipe having a plurality of furcation branches, and wherein at least one portion of the liquid-cooling pipe is adjacent or attached to one side of an inner wall of the housing of the network equipment power supply, and another portion is arranged in middle of the housing of the network equipment power supply.

3. The heat dissipation system according to claim 1, wherein the liquid-cooling pipe is a straight liquid-cooling pipe, or a bending liquid-cooling pipe, or a multidirectional liquid-cooling pipe having a plurality of furcation branches, and wherein the multidirectional liquid-cooling pipe has a single liquid inlet and a single liquid outlet, and the plurality of furcation branches share the single liquid inlet and the single liquid outlet.

4. The heat dissipation system according to claim 1, wherein the components arranged around the liquid-cooling pipe are in direct contact with the liquid-cooling pipe, or thermally coupled to the liquid-cooling pipe through a heat conducting member.

5. The heat dissipation system according to claim 1, wherein the airflow comes from a fan of a network equipment cabinet.

6. The heat dissipation system according to claim 1, wherein the airflow comes from a fan of the network equipment power supply.

7. The heat dissipation system according to claim 6, wherein the fan of the network equipment power supply is arranged within the housing of the network equipment power supply, or arranged out of the housing of the network equipment power supply.

8. The heat dissipation system according to claim 1, further comprising hydraulic quick connectors on the liquid inlet and the liquid outlet.

9. The heat dissipation system according to claim 1, wherein the network equipment power supply is suitable for a server or a data center.

10. The heat dissipation system according to claim 1, wherein the liquid inlet and the liquid outlet are arranged on a same side of the first heat dissipation device.

11. The heat dissipation system according to claim 1, wherein the liquid inlet and the liquid outlet are arranged on different sides of the first heat dissipation device.

12. A network equipment power supply, comprising the heat dissipation system according to claim 1.

13. The heat dissipation system according to claim 1, wherein the liquid-cooling pipe is configured to absorb heat generated by the components arranged around the liquid-cooling pipe and take away the absorbed heat by means of the liquid-cooling medium flowing inside the liquid-cooling pipe,     wherein the liquid-cooling pipe is a multidirectional liquid-cooling pipe comprising a shared portion and a plurality of furcation branch portions, the shared portion including a shared inlet pipe segment connected to the liquid inlet and a shared outlet pipe segment connected to the liquid outlet, each of the furcation branch portions comprising a branch inlet pipe segment connected to the shared inlet pipe segment and a branch outlet pipe segment connected to the shared outlet pipe segment,     wherein the shared inlet pipe segment is disposed above the shared outlet pipe segment, and wherein the branch inlet pipe segments are disposed above the corresponding branch outlet pipe segments, respectively.

14. The heat dissipation system according to claim 1, wherein the liquid-cooling pipe is a straight liquid-cooling pipe, or a bending liquid-cooling pipe, or a multidirectional liquid-cooling pipe having a plurality of furcation branches.

\* \* \* \* \*